April 1, 1969 G. R. PRUETT 3,436,549

P-N PHOTOCELL EPITAXIALLY DEPOSITED ON TRANSPARENT SUBSTRATE AND METHOD FOR MAKING SAME

Filed Nov. 6, 1964

George R. Pruett
INVENTOR

By John D. Graham
Attorney

United States Patent Office 3,436,549

Patented Apr. 1, 1969

3,436,549

P-N PHOTOCELL EPITAXIALLY DEPOSITED ON TRANSPARENT SUBSTRATE AND METHOD FOR MAKING SAME

George R. Pruett, Richardson, Tex., assignor to Texas Instruments Incorporated, Dallas, Tex., a corporation of Delaware Filed Nov. 6, 1964, Ser. No. 409,457
Int. Cl. H01l *15/02;* H01c *7/08;* H01j *39/12*
U.S. Cl. 250—211 5 Claims This invention relates to photosensitive or photoresponsive semiconductor devices, and more particularly to photoresistors, photovoltaic diodes, and other such photodetective devices which are responsive to radiant energy. More particularly, the invention relates to such devices formed in thin layers epitaxially formed on a substrate of semiconductor material which is substantially transparent to the radiant energy to which such devices are responsive, and to methods of making same. As used herein, the term photosensitive semiconductor devices includes photovoltaic, photoconductive, and photoelectromagnetic semiconductor devices.

The present invention is particularly useful with (though not limited to) semiconductor infrared detectors and other light-sensitive devices which are operated at low temperatures.

The detectivity of a photodetector is directly related to the amount of light energy absorbed by the detector and to the internal noise of the detector. Accordingly, detectivity can be improved by increasing the amount of light absorbed per unit of surface area of the detector and by reducing the noise The former may be accomplished by optically focusing incident radiation on the detector surface with a lens. The latter is generally accomplished by operating the detector at very low temperatures. Internal noise is also considerably reduced by reducing the size of the detector. The present invention is ideally suited for economical and simple construction of such miniature devices.

In the prior art, semiconductor photodetectors have been made with lens or other materials physically joined at the photosensitive surface to provide focusing of radiant energy or physical support for the device. However, such materials often reduce the amount of energy available at the detector surface by internal reflection or absorption.

Monocrystalline photodetectors, such as, for example, indium arsenide detectors, are known to be far superior to polycrystalline or evaporated devices such as those made from lead sulfide. However, monocrystalline devices are usually formed on one surface of a monocrystalline block or wafer, thus all contacts and leads must be attached to the exposed surface of the detector. Consequently, the amount of light absorbed per unit of active surface area is generally limited by the necessary shading of the photosensitive surface by contacts and leads. Thus, the advantages of using monocrystalline detectors were not fully utilized.

In accordance with this invention, monocrystalline photodetectors are formed epitaxially on a crystalline substrate material which has a wider band gap than the photodetector material, thus is substantially transparent to the wavelength of light to be detected. Therefore the substrate is used as an optical element through which the radiation passes before being absorbed by the photodetector. The leads may then be connected with the exposed surface of the detector without shading the active surface.

Briefly, in accordance with the present invention, a photodetector is formed on a single crystalline block of wider band gap semiconductor material, which eliminates shading of the photosensitive surface while permitting simple and economical manufacture and assembly. Furthermore, since the material of the substrate is also semiconductor material, materials suitable for fabrication of the detector of the invention may be advantageously selected to closely match coefficients of thermal expansion of the substrate with that of the detector, thus avoiding undesirable unequal expansion or contraction of parts when the devices are subjected to substantial temperature changes. This feature also avoids the problem of thermal shock which may result if the temperature change is rapid.

It is therefore an object of the invention to provide a photosensitive device which is unencumbered by electrical contacts shading the photosensitive surface.

Another object of the invention is to provide a photodetector which is substantially insensitive to thermal shock.

Yet another object of the invention is a method of making monocrystalline photosensitive devices.

These and other objects, features, and advantages will become more readily understood from the following detailed description, taken in conjunction with the appended claims and attached drawings, in which:

Figure 1:
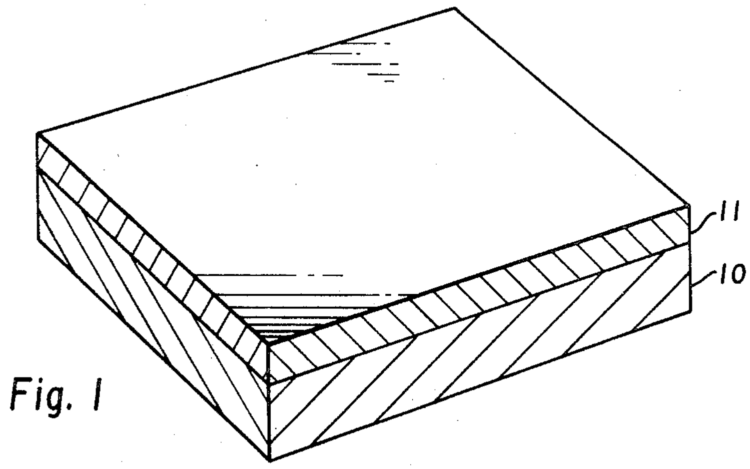
FIGURE 1 is a perspective view partially in section of a transparent crystalline wafer with a layer of photosensitive semiconductor material on one surface thereof.

Dimensions of certain of the parts as shown in the drawings have been modified and/or exaggerated for the purposes of clarity of illustration.

Similar reference characters indicate corresponding parts throughout the several views of the drawing.

Referring specifically to FIGURE 1, a crystalline substrate wafer 10 is shown having a monocrystalline epitaxial layer 11 formed on one side thereof. Layer 11, which is formed into the photosensitive portion of the device as hereinafter described, has a smaller energy band gap than that of the substrate 10, so that the substrate will be substantially transparent to the wavelength of radiation which will be absorbed by layer 11. To assure similarity of coefficients of thermal expansion and crystalline continuity, the unit cell size of the substrate 10 and that of the epitaxial layer 11 should be compatible. By compatible unit cell size is meant that the atomic spacing within the crystalline lattice of each respective material is sufficiently similar to the other to permit the epitaxial growth or extension of one material upon the substrate material without inducing excessive lattice strain at the material interface and throughout the epitaxial layer. Examples of semiconductor materials which may be used in this structure are: indium arsenide on gallium arsenide substrates, germanium on gallium arsenide substrates, and indium arsenide on gallium antimonide substrates. Numerous other suitable combinations of semiconductor materials may be used, choices of which will be dictated by the characteristics desired in a particular photosensitive device, such as, for example, the wavelength to be detected and the cost of the materials to be used.

Conventional methods may be used to form monocrystalline epitaxial layers of semiconductor materials and hence methods of forming such layers need not be described here.

Figure 2:
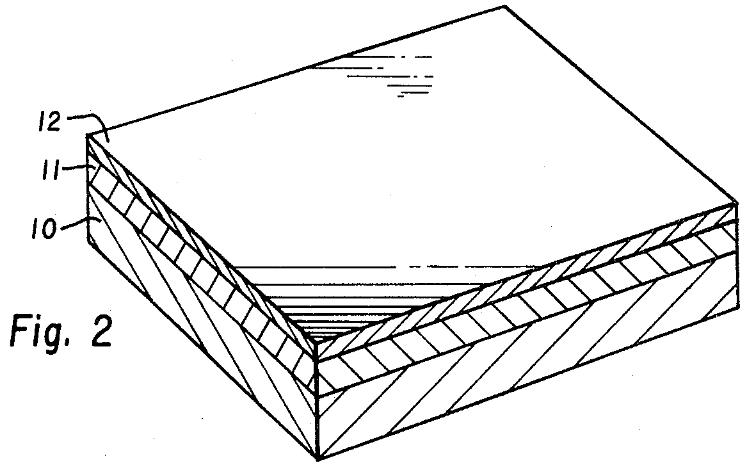
FIGURE 2 is a perspective view partially in section of a transparent crystalline wafer with a layer of photosensitive semiconductor material having a P-N junction formed within the layer.

A P-N junction may be formed in the epitaxial layer 11 by the diffusion of the proper conductivity-type determining impurities thereinto. For example, if the layer 11 is N-type indium arsenide, a P-type region 12, as shown in FIGURE 2, may be formed by diffusing a P-type impurity, such as zinc or cadmium, into a portion of the layer 11 to form a P-type region 12. Alternatively, P-type layer 12 may be formed by epitaxial deposition of P-type indium arsenide on the surface of the N-type indium arsenide layer 11, thereby forming a P–N junction.

It will be noted that only the epitaxial layer need be monocrystalline. The substrate material may be polycrystalline if the degree of polycrystallinity does not substantially degrade its optical properties. However, the portion of the substrate upon which the photodetector material is deposited should be monocrystalline to assure moncrystalline formation of the epitaxial layer.

Figure 3:
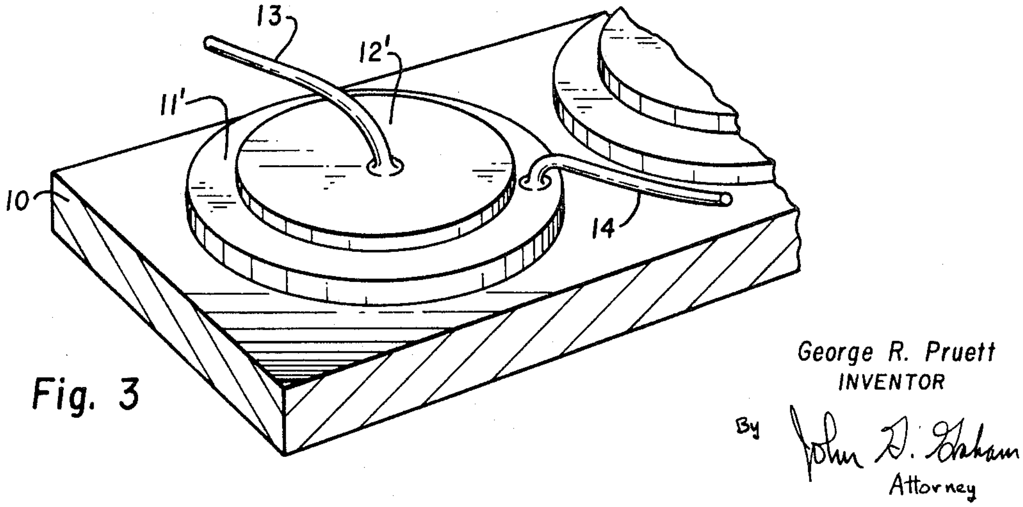
FIGURE 3 is a perspective view of one photovoltaic diode of an array of such diodes formed from the wafer of FIGURE 2.

The assembly of FIGURE 2 is then further processed to form one embodiment of the invention illustrated in FIGURE 3. A crystalline substrate 10, preferably monocrystalline, for example N-type or intrinsic gallium arsenide, is shown having a completed photovoltaic diode formed on one side thereof. The photovoltaic diode is formed by removing a part of the epitaxial layer 11, leaving a circular portion 11′ thereof in place on the substrate 10. As shown in FIGURE 3, the circular portion 11′ may be formed by conventional masking and etching techniques used in making semiconductor mesa devices. The indium arsenide layers 11 and 12 are further masked and etched to leave a smaller circular portion 12′ of layer 12 superimposed on the center of layer 11′. Ohmic contacts 13 and 14 are electrically attached to the P-type layer 12′ and the N-type layer 11′, respectively. The resultant assembly is an indium arsenide photovoltaic diode having a gallium arsenide substrate adjacent the photosensitive surface thereof, and having both electrical contacts on the opposite side of the diode thereby advantageously avoiding deleterious shading of the photosensitive surface. It will be noted that the photosensitive material 11′ and 12′ of the photovoltaic diode, being epitaxially grown on the gallium arsenide substrate 10, is formed as a contiguous monocrystalline extension of the crystalline lattice of said substrate. Radiation passing through the gallium arsenide substrate 10 is absorbed by the indium arsenide detector through a surface which is unencumbered by electrodes shading the photosensitive material. Thus the entire photosensitive surface of the photovoltaic diode adjacent the gallium arsenide substrate 10 may be utilized as a photodetector. Since the gallium arsenide band gap, 1.38 ev., is greater than the indium arsenide band gap, 0.33 ev., the gallium arsenide substrate 10 is transparent to the wavelengths to which the indium arsenide detector is sensitive. The device described is particularly suited for detection of radiation in the 1–4 micron range, since gallium arsenide is transparent to wavelengths in this range, while indium arsenide absorbs radiation of these wavelengths.

Although only a single detector cell is shown on the substrate 10 of FIGURE 3, it will be understood that arrays of two or more detectors may be produced simultaneously on a single substrate by the method described above.

It will be further noted that the substrate 10 may be large enough to provide mechanical support and rigidity to the device. Consequently, the photosensitive portion of the device, namely, layers 11′ and 12′, may be very thin. Furthermore, since the P-N junction is substantially parallel to the flat surface of the substrate 10, all light energy absorbed by the photodetector will create hole-electron pairs within a minority carrier diffusion length of the P-N junction.

It will be further understood that in accordance with this invention, other substrate materials may be selected to provide light filters which transmit desired wavelengths while absorbing higher wavelengths, thus improving the sensitivity of the photovoltaic diode.

Although the invention has been described in detail only with reference to photovoltaic diodes, it will be readily understood by those skilled in the art that the principles herein disclosed may likewise be advantageously applied to the production of other photosensitive devices such as photoresistors and photoelectromagnetic semiconductor devices.

For example, photoconductive detectors may be produced in accordance with the invention by forming a layer of photoconductive material on one surface of an insulating substrate which is substantially transparent to the wavelength to which the photoconductive layer is responsive. Thus for example, a layer of indium arsenide epitaxially deposited on one surface of an insulating substrate such as cadmium selenide, zinc telluride, or semi-insulating gallium arsenide will serve as a photoconductive detector responsive to light which passes through the insulating substrate.

It is to be understood that the above described embodiment of the invention is merely illustrative of the principles of the invention. Numerous other arrangements and modifications may be devised by those skilled in the art without departing from the spirit and scope of the invention as defined by the appended claims.

What is claimed is:

1. The combination comprising:

(a) a crystalline substrate substantially transparent to a selected wavelength of radiation;

(b) a crystalline photosensitive device contiguous with at least part of one surface of said substrate and forming a monocrystalline extension of the lattice of said part of said substrate, said photosensitive device being responsive to said selected wavelength of radiation, and (c) electrodes electrically connected with said photosensitive device.

2. A photosenstive device comprising:

(a) a crystalline substrate substantially transparent to a selected wavelength of radiation;

(b) a first layer of crystalline semiconductor material of a first conductivity-type and sensitive to said selected wavelength of radiation, said first layer being contiguous with one surface of said substrate and forming a monocrystalline extension of the lattice of said substrate;

(c) a second layer of crystalline semiconductor material of a second conductivity-type contiguous with part of the exposed surface of said first layer and forming a monocrystalline extension of the lattice of said first layer;

(d) an electrode electrically connected with said first layer on the surface of said layer which is opposite said substrate, and (e) an electrode electrically connected with said second layer.

3. A photosensitive device comprising:

(a) a crystalline semiconductor substrate, (b) a monocrystalline layer of semiconductor material contiguous with and forming a monocrystalline extension of at least a portion of the crystalline lattice of said substrate, said layer having a smaller band gap than said substrate and having a P-N junction within said layer substantially parallel to the surface of said substrate;

(c) an electrode electrically connected with the P-type portion of said layer, and (d) an electrode electrically connected with the N-type portion of said layer.

4. The method of making a photosensitive device comprising the steps of:

(a) epitaxially depositing a monocrystalline layer of semiconductor material of a first conductivity-type on one surface of a crystalline semiconductor substrate to form a monocrystalline extension of the lattice of said substrate, said substrate having a greater band gap than said layer, (b) diffusing conductivity-determining impurities of a second conductivity-type into the exposed surface of said layer to form a P-N junction within said layer, and (c) attaching an electrode to each of the P-type portion and to the N-type portion of said layer.

5. A photosensitive device comprising:

(a) a monocrystalline substrate which is substantially transparent to a selected wavelength of radiation, (b) a first layer of monocrystalline semiconductor material of a first conductivity-type and sensitive to said selected wavelength of radiation, said first layer being contiguous with one surface of said substrate and forming a monocrystalline extension of the crysalline lattice of said substrate, the junction between said one surface of said substrate and said first layer comprising a photosensitive surface, said first layer also having a second surface on a side thereof opposite said photosensitive surface, (c) a second layer of monocrystalline semiconductor material of a second conductivity-type opposite to said first conductivity-type and being contiguous with part of said second surface of said first layer and forming a monocrystalline extension of the lattice of said first layer, (d) first and second electrodes each respectively electrically connected with said first and second layers on a side thereof which is opposite said photosensitive surface thereby to prevent shading of said photosensitive surface.

References Cited

UNITED STATES PATENTS

| | | | |
|---|---|---|---|
| 2,794,846 | 6/1957 | Fuller | 317—235 |
| 3,020,412 | 2/1962 | Byczkowski | 250—211 |
| 3,076,861 | 2/1963 | Samulon et al | 136—89 |
| 3,082,283 | 3/1963 | Anderson | 317—235 |
| 3,089,794 | 5/1963 | Marinace | 148—175 |
| 3,165,811 | 1/1965 | Kleimack et al. | 148—175 |
| 3,223,904 | 12/1965 | Warner et al. | 148—175 |
| 3,184,350 | 5/1965 | Marinace | 317—235 |
| 3,304,430 | 2/1967 | Biard et al. | 317—235 |
| 3,371,213 | 2/1968 | Adams et al. | 250—211 |

OTHER REFERENCES

"Electronic Circuits" by Angelo McGraw-Hill, 1958, pp. 198–199.

RALPH G. NILSON, *Primary Examiner.*

MARTIN ABRAMSON, *Assistant Examiner.*

U.S. Cl. X.R.

317—235